(12) United States Patent
Kamal et al.

(10) Patent No.: US 7,283,083 B1
(45) Date of Patent: Oct. 16, 2007

(54) PIPELINED ANALOG-TO-DIGITAL CONVERTER WITH MID-SAMPLING COMPARISON

(75) Inventors: Abu-Hena Mostafa Kamal, Santa Clara, CA (US); Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 260 days.

(21) Appl. No.: 11/161,502

(22) Filed: Aug. 5, 2005

(51) Int. Cl.
*H03M 1/38* (2006.01)
(52) U.S. Cl. ...................................... 341/161; 341/160
(58) Field of Classification Search ......... 341/130–170
See application file for complete search history.

(56) References Cited

U.S. PATENT DOCUMENTS

| | | | |
|---|---|---|---|
| 6,724,338 B1 | 4/2004 | Min et al. | |
| 6,784,824 B1 * | 8/2004 | Quinn | 341/172 |
| 6,819,280 B2 * | 11/2004 | Huang et al. | 341/162 |
| 6,881,942 B2 * | 4/2005 | Huang et al. | 250/208.1 |

OTHER PUBLICATIONS

Cormac S.G. Conroy, "A High Spped Parallel Pipeline A/D Converter Technique in CMOS," Memorandum No. UCB/ERL M94/9, Feb. 15, 1994, pp. 53-68, Electronics Research Laboratory, University of California, Berkeley.
Stephen H. Lewis and Paul r. Gray, "A Pipelined 5-Msample/s 9-bit Analog-to-Digital Converter," JSS, vol. SC-22, No. 6, Dec. 1987 pp. 954-961.
Roubik Gregorian, "Introduction to CMOS OP-AMPS and Comparators," Ch. 5, 1999, pp. 175-213, John Wiley & Sons, Inc., New York, Chichester, Weinheim, Brisbane, Singapore, Toronto.
William C. Black, Jr., et al., "Time Interleaved Converter Arrays," IEEE JSSCC, vol. SC-15, No. 6, Dec. 1980, pp. 1022-1029.

* cited by examiner

*Primary Examiner*—Lam T. Mai
(74) *Attorney, Agent, or Firm*—Vedder, Price, Kaufman & Kammholz, P.C.

(57) ABSTRACT

A double-sampled pipeline analog-to-digital conversion (ADC) system and method in which latching of the intrastage digital quantization signals occurs approximately midway the leading and trailing edges of the clock signals.

12 Claims, 5 Drawing Sheets

φ1d 31aad

φ2d 31abd

FIG. 4D

CONVENTIONAL LATCH

FIG. 4E

RESET 31ac

FIG. 4F

CONVENTIONAL COMPARATOR OUTPUT

NEW LATCH 31b

FIG. 4I

NEW COMPARATOR OUTPUT 17ba

FIG. 4J

PIPELINED ANALOG-TO-DIGITAL CONVERTER WITH MID-SAMPLING COMPARISON

BACKGROUND OF THE INVENTION

The present invention relates to analog-to-digital converter (ADC) circuits, and in particular, to pipelined ADCs.

Many forms of digital signal processing systems require data conversion devices to quantize analog data signals for use in the digital signal processing. Such data conversion devices often include an ADC. One type of ADC which is perhaps most often used is a pipelined ADC.

One common form of ADC uses a double sampling technique, which increases data throughput by a factor of two. Such sampling relies upon end sampling comparison in which the leading, e.g., rising, edge of the clock is used to derive all critical timing signals, while the trailing, e.g., falling, clock edge is ignored. The data hold time is defined as one clock cycle minus the time needed for the comparator strobe and reset. This poses two limitations on the architecture of the ADC. First, hold time is sacrificed for strobe time, thereby limiting conversion efficiency. Peak efficiency is achieved when the hold time is one full clock cycle minus the reset time. Second, a very fast comparator must be used so as to allow strobe time to be reduced, and thereby achieve high efficiency.

SUMMARY OF THE INVENTION

In accordance with the presently claimed invention, a double-sampled pipeline analog-to-digital conversion (ADC) system and method is provided in which latching of the intrastage digital quantization signals occurs approximately midway the leading and trailing edges of the clock signals.

In accordance with one embodiment of the presently claimed invention, a double-sampled pipeline analog-to-digital conversion (ADC) circuitry having a plurality of serially coupled 1.5 bit ADC stages includes electrodes, residue signal generation circuitry, sub-ADC circuitry, digital-to-analog conversion (DAC) circuitry, and timing and control circuitry. At least one electrode is to convey an upstream residue signal from an upstream ADC stage. The residue signal generation circuitry is coupled to the at least one electrode and responsive to the upstream residue signal, an analog quantization signal, a reset control signal and a first portion of a plurality of clock signals by providing a downstream residue signal. The sub-ADC circuitry is coupled to the at least one electrode and responsive to the upstream residue signal and a latch control signal by providing first and second digital quantization signals. The digital-to-analog conversion (DAC) circuitry is coupled to the sub-ADC circuitry and the residue signal generation circuitry, and responsive to the first and second digital quantization signals by providing the analog quantization signal. The timing and control circuitry is coupled to the residue signal generation circuitry and the sub-ADC circuitry, and responsive to at least a main clock signal by providing the reset control signal, the first portion of the plurality of clock signals and the latch control signal, wherein each one of the first portion of the plurality of clock signals includes respective leading and trailing signal state transitions, the latch control signal includes leading and trailing signal state transitions, and at least one of the leading and trailing latch control signal state transitions occurs approximately midway the leading and trailing clock signal state transitions.

In accordance with another embodiment of the presently claimed invention, a double-sampled pipeline analog-to-digital conversion (ADC) circuitry having a plurality of serially coupled 1.5 bit ADC stages includes residue signal generator means, sub-ADC means, digital-to-analog conversion (DAC) means, and timing and control means. The residue signal generator means is for receiving an upstream residue signal from an upstream ADC stage, an analog quantization signal, a reset control signal and a first portion of a plurality of clock signals and in response thereto generating a downstream residue signal. The sub-ADC means is for receiving the upstream residue signal and a latch control signal and in response thereto generating first and second digital quantization signals. The digital-to-analog conversion (DAC) means is for receiving the first and second digital quantization signals and in response thereto generating the analog quantization signal. The timing and control means is for receiving at least a main clock signal and in response thereto generating the reset control signal, the first portion of the plurality of clock signals and the latch control signal, wherein each one of the first portion of the plurality of clock signals includes respective leading and trailing signal state transitions, the latch control signal includes leading and trailing signal state transitions, and at least one of the leading and trailing latch control signal state transitions occurs approximately midway the leading and trailing clock signal state transitions.

In accordance with still another embodiment of the presently claimed invention, a method of performing double-sampled pipeline analog-to-digital conversion (ADC) of a signal with a plurality of serially coupled 1.5 bit ADC stages includes:

receiving an upstream residue signal from an upstream ADC stage;

receiving an analog quantization signal;

receiving a reset control signal;

receiving a first portion of a plurality of clock signals;

receiving a latch control signal;

receiving at least a main clock signal;

generating a downstream residue signal in response to the upstream residue signal, the analog quantization signal, the reset control signal and the first portion of a plurality of clock signals;

generating first and second digital quantization signals in response to the upstream residue signal and the latch control signal;

generating the analog quantization signal in response to the first and second digital quantization signals; and generating the reset control signal, the first portion of the plurality of clock signals and the latch control signal in response to at least the main clock signal;

wherein each one of the first portion of the plurality of clock signals includes respective leading and trailing signal state transitions, the latch control signal includes leading and trailing signal state transitions, and at least one of the leading and trailing latch control signal state transitions occurs approximately midway the leading and trailing clock signal state transitions.

BRIEF DESCRIPTION OF THE DRAWINGS

FIG. 4 is a signal timing diagram for selected signals in the circuits of FIGS. 2, 3A, 3B, 3C and 3D.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
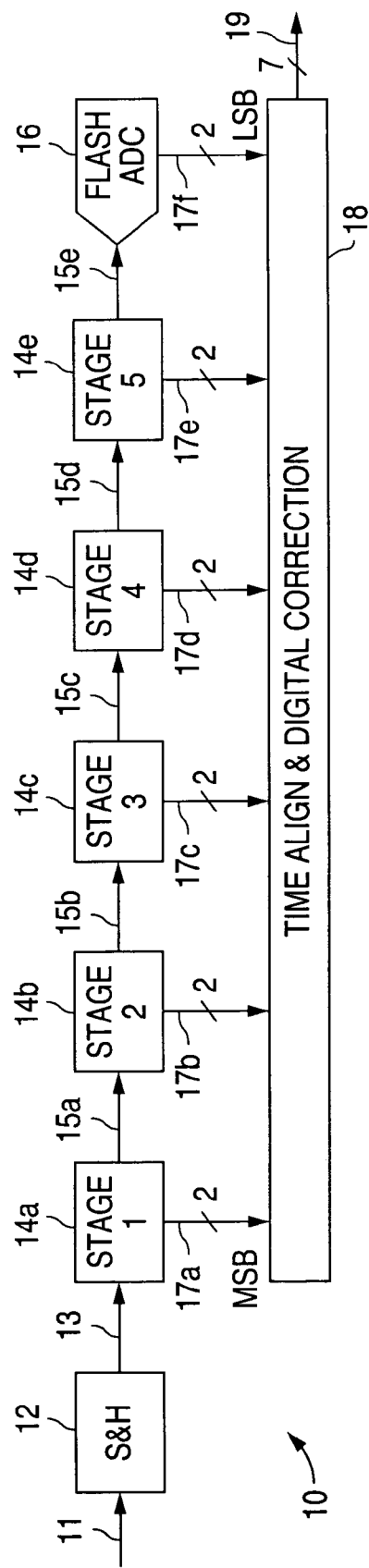
FIG. 1 is a block diagram of a conventional pipelined ADC circuit.

Referring to FIG. 1, a conventional pipelined ADC 10 includes a sample and hold stage 12, multiple stages 14 of sub-converters (discussed in more detail below), a FLASH ADC 16, and a digital stage 18 that performs time alignment and digital correction functions. As is well known in the art, an input analog signal 11 is sampled and held by the sample and hold stage 12, thereby providing a stable analog signal 13 for quantization. This signal 13 is converted by the first sub-converter stage 14a to a digital signal 17a having M+1 bits, and an analog residue signal 15a (discussed in more detail below). The digital signal 17a, while having M+1 bits, provides M bits of resolution for the final output signal 19. In this example, the number of bits is 7 and the resolution M is 1. For this first stage 14a, the digital signal 17a will correspond to the most significant bit (MSB) of the final digital output signal 19. Similar conversions are performed by the remaining sub-converter stages, 14b, 14c, 14d, 14e to provide digital signals 17b, 17c, 17d, 17e corresponding to less significant bits of the final digital output signal 19, as well as inter-stage residue signals 15b, 15c, 15d, 15e.

The final residue signal 15e is converted by the FLASH ADC 16 to produce the last digital signal 17f which has M+1 bits of resolution corresponding to the least significant bits (LSBs) of the final digital output signal 19. As noted above, the time align and digital correction stage 18 processes the incoming digital signals 17 appropriately to provide the final digital output signal 19. (A more detailed discussion of such a conventional pipelined ADC can be found in U.S. Pat. No. 6,710,732, the disclosure of which is incorporated herein by reference.)

The adjacent stages of the pipelined ADC 10 operate on opposite phases of a clock signal. In a double sampling system, the sampling and amplification processes run concurrently in each stage. This doubles the data throughput at a given clock rate. Output from all stages are digitally corrected to produce the final output code 19 that corresponds to a specific analog value of the input signal 11. Such concurrent operation of these stages advantageously allows a pipelined architecture to provide high throughput rates, while occupying less integrated circuit die area than alternative architectures. For example, at any given point in time, the first stage 14a operates on the most recent input 13 while all subsequent stages 14b, 14c . . . operate on residues 15a, 15b, . . . from the previous samples. Each stage 14 is buffered by a switched capacitor sample and hold gain block, thereby allowing the concurrent processing. Since the stages work concurrently, the number of stages used to obtain a given resolution does not limit the speed of the converter operation. In this particular ADC 10, each stage effectively generates 1.5 bits. As is well known, this means that a 1.5 bit per stage pipelined ADC architecture resolves 2 bits in each stage, with the "1.5 bits per stage" referring to the fact that each stage produces the 3 output codes of 00, 01 and 10, while the 11 code is left unused. Additionally, this architecture allows for a large correction range of one-fourth of the reference voltage (Vref/4) to compensate for comparator offsets and gain errors.

Figure 2:
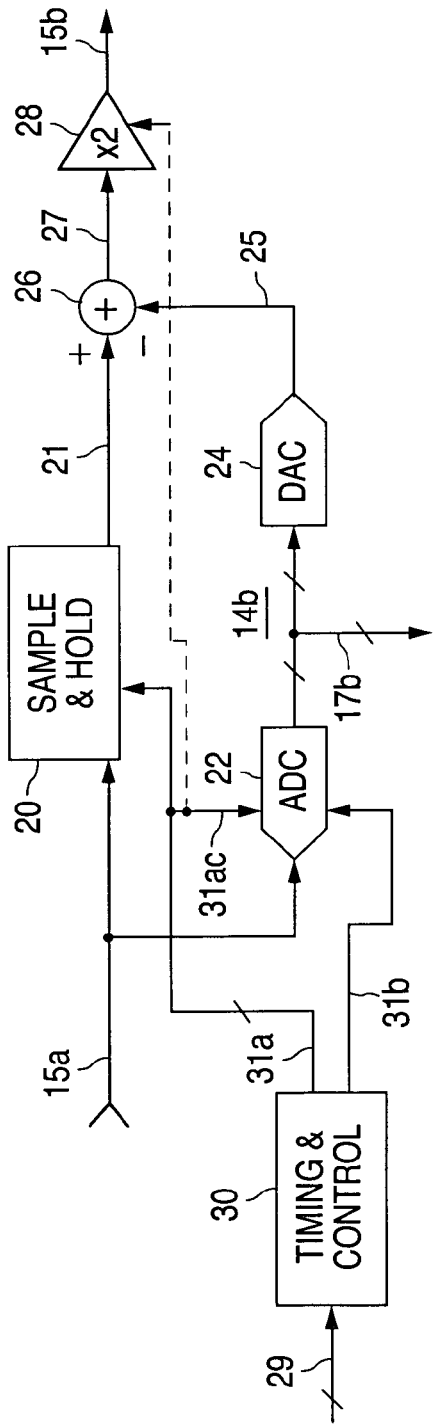
FIG. 2 is a block diagram of a sub-converter for a pipelined ADC circuit for being controlled with timing and control circuitry in accordance with one embodiment of the presently claimed invention.

Referring to FIG. 2, using the second stage 14b of the pipelined ADC 10 of FIG. 1 as an example, each sub-converter 14 includes a sample and hold circuit 20, a sub-ADC 22, a digital-2-analog converter (DAC) 24, a signal combiner 26 (e.g., a summer), and an amplifier 28 with a gain of M+1, all interconnected substantially as shown. The incoming analog signal, i.e., the residue signal 15a from the upstream stage 14a, is sampled and held by the sample and hold circuit 20 to provide a stable signal 21 for summing in the signal combiner 26. This signal 15a is also converted by the sub-ADC 22 to the digital signal 17b. This digital signal 17b is converted by the DAC 24 back to an analog signal 25 which is subtracted from the sampled and held signal 21. The resultant signal 27 is amplified by the amplifier 28 to produce the residue signal 15b for the subsequent downstream stage 14c. Additionally, as discussed in more detail below, a time alignment circuit 32 is provided within the sub-ADC 22 for time-aligning the output signal bits 17b prior to the digital correction.

In accordance with the presently claimed invention, a timing and control circuit 30 provides timing and control signals 31 for each stage 14 of the ADC 10. Using a number of input signals 29, including a master clock signal, as discussed in more detail below, the timing and control circuit 30 provides a number of control signals 31a for the sample and hold circuit 20, and a latch control circuit 31b for the sub-ADC 22. Additionally, one of the control signals 31a provided to the sample and hold circuit 20, i.e., a reset signal 31ac, can also be provided for resetting the output amplifier 28.

Figure 3A:
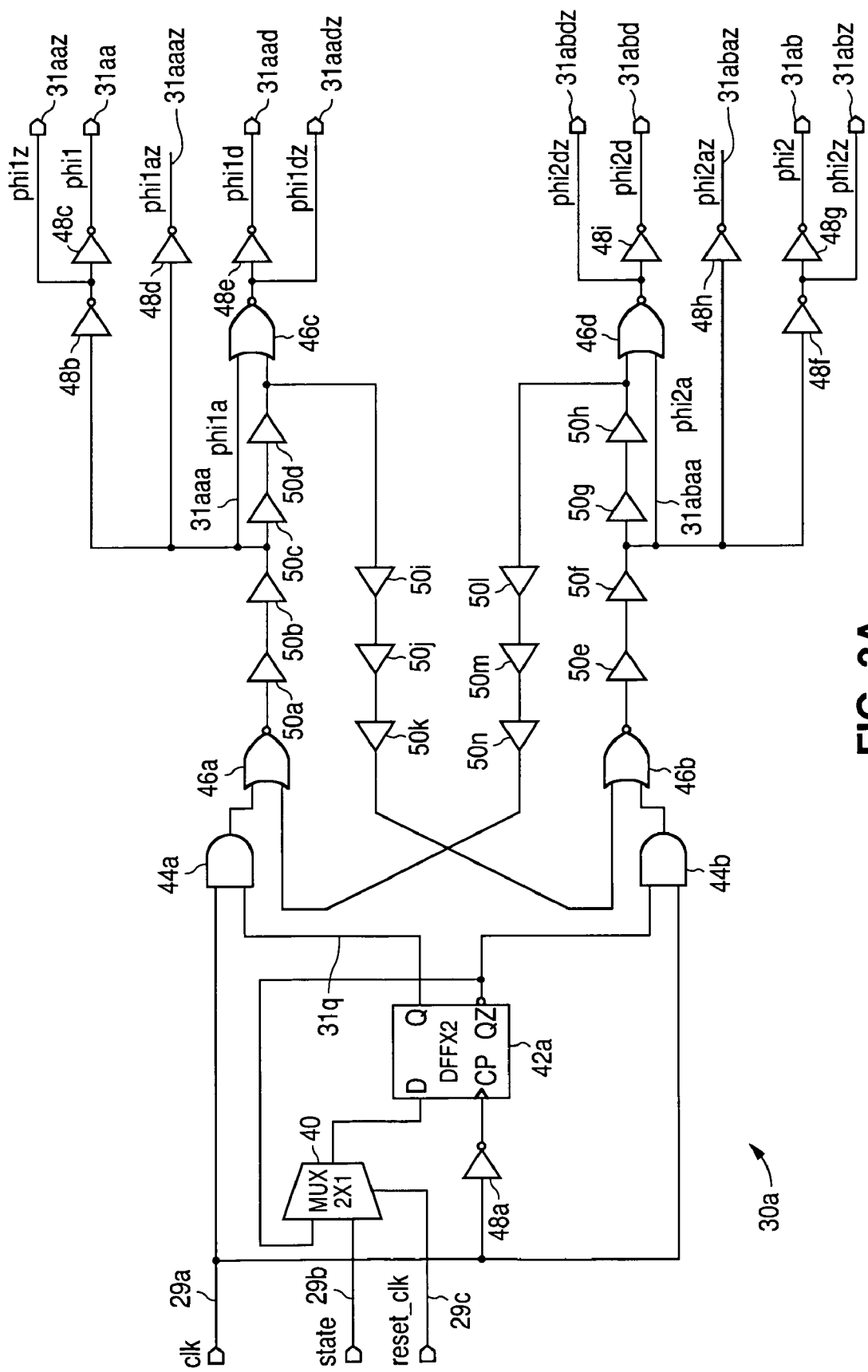
FIGS. 3A, 3B and 3C are logic diagrams of portions of a timing and control circuit in accordance with one embodiment of the presently claimed invention.

Referring to FIG. 3A, one portion 30a of the timing and control circuit 30 in accordance with one embodiment of the presently claimed invention includes clock generator circuitry having a multiplexor 40, flip-flop 42a, AND gates 44, NOR gates 46, logic inverters 48, and signal buffers 50, all interconnected substantially as shown. The incoming signals include a master clock signal 29a, a state signal 29b and a reset clock 29c, all of which are generated elsewhere within the ADC system.

Based upon timing by the master clock signal 29a, a control signal 31q is generated and logically ANDed with the master clock signal 29a, thereby producing a number of related and delayed clock signals. Clock signals 31aa and 31ab are the primary clock signals, i.e., the non-overlapping clock signals used for driving the alternating stages 14 of the ADC 10 (FIG. 1). Corresponding to the first primary clock signal phase 31aa, two related inverted clock signals 31aaz, 31aaaz, and two related but selectively delayed (discussed in more detail below) clock signals 31aad, 31aadz are also generated. Similarly, corresponding to the second clock signal phase 31ab, two related inverted clock signals 31abz, 31abaz, and two related but selectively delayed clock signals 31abd, 31abdz are also generated. These various clock signals are used in other portions 30b (FIG. 3B), 30c (FIG. 3C) of the timing and control circuit 30, as discussed in more detail below. The selectively delayed clock signals 31aad, 31aadz, 31abd, 31abdz are provided as part of the set 31a of control signals to the sample and hold circuit 20 to allow selected switches within the sample and hold circuit 20 to turn off slightly later during sampling, relative to the primary clock signal phases 31aa, 31ab, thereby reducing the effects of charge injection as a function of the input signal.

Figure 3B:
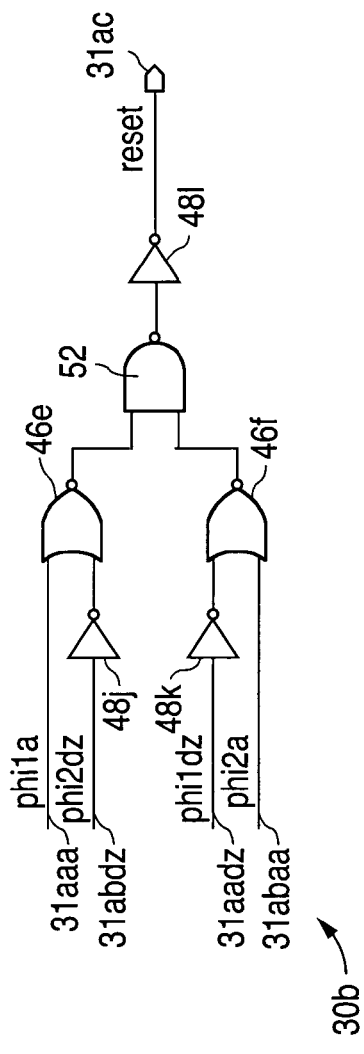

Referring to FIG. 3B, another portion 30b of the timing and control circuit 30 also includes NOR gates 46 and inverters 48, along with a NAND gate 52, all interconnected substantially as shown. Clock signals 31aaa, 31abdz, 31abaa and 31aadz, generated by the clock generator circuit 30a, are logically processed to produce the reset signal 31ac provided as part of the set 31a of timing and control signals provided to the sample and hold circuit 20.

Figure 3C:
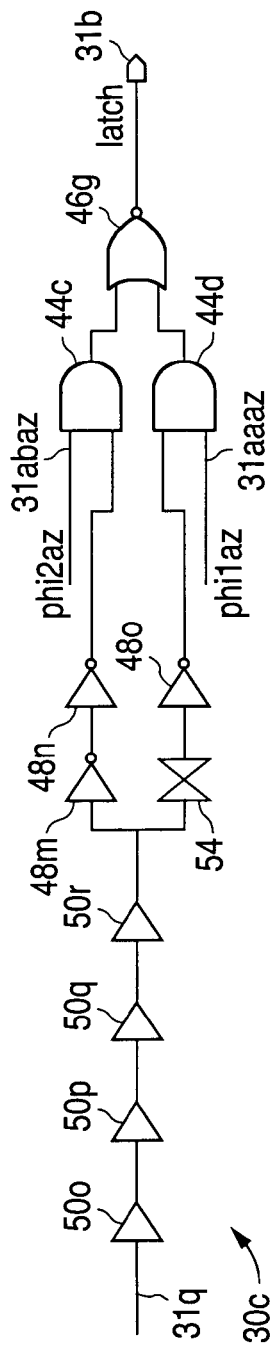

Referring to FIG. 3C, another portion 30c of the timing and control circuit 30 is used to generate the latch control signal 31b. This circuit 30c also includes AND gates 44, a NOR gate 46g, inverters 48, buffer amplifiers 50, and a transmission gate 54, all interconnected substantially as shown. Signal 31q, generated within the clock generator circuit 30a, is processed by the buffer amplifiers 50, inverters 48 and transmission gate 54, prior to being clocked by clock signals 31aza and 31azb, as shown.

Figure 3D:
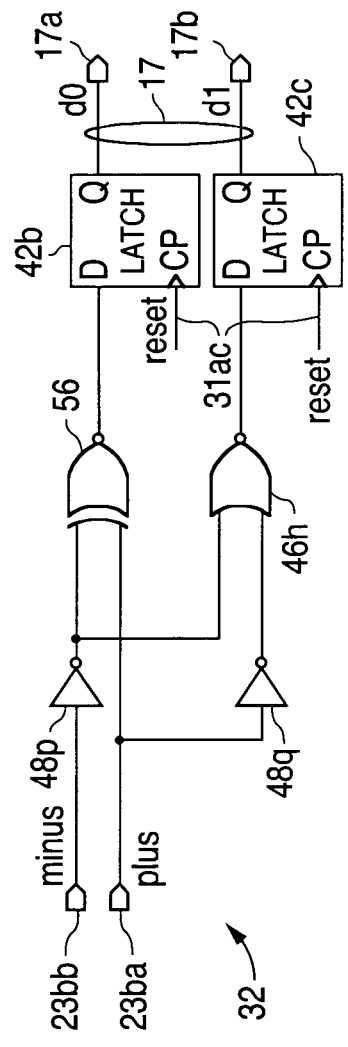
FIG. 3D is a logic diagram of a time alignment circuit in accordance with another embodiment of the presently claimed invention.

Referring to FIG. 3D, the timing alignment circuit 32 also includes flip-flops 42, a NOR gate 46h, inverters 48, and an exclusive-OR gate 56, all interconnected substantially as shown. The two voltage comparator output signals 23ba, 23bb (discussed in more detail below) are processed by the inverters 48, NOR gate 46 and exclusive-OR gate 56, as shown, prior to being latched by the latches 42 in accordance with the reset signal 31ac. This produces the time-aligned digital output bits 17a, 17b for subsequent digital correction.

Referring to FIG. 4, operation of the individual stages 14 of the pipelined ADC 10 using the timing and control signals provided by the timing and control circuit 30 can be better understood. As shown, the primary clock signals 31aa, 31ab are non-overlapping. Also shown are the selectively delayed (with respect to their trailing clock signal edges) clock signals 31aad, 31abd. The reset signal 31ac is provided as shown.

Using a prior art sub-converter circuit (not shown) in which end sampling comparison is used, the conventional latch and comparator output signals are generated as shown. The trailing edge of clock signal 31aa indicates the end of sampling. The rising edge of the conventional latch signal indicates that the sub-ADC comparators are beginning their signal comparisons. The trailing edge of clock signal 31aad indicates the end of the hold operation. This means that the comparator has the time from the conventional latch signal rising edge to the trailing edge of clock signal 31aad to make its signal comparison. In a typical implementation, this time can be as little as 200 picoseconds, thereby requiring a very fast comparator. The interval between the trailing edge of clock signal 31aad and the leading edge of clock signal 31ab is the reset period, i.e., the interval during which the reset signal 31ac is asserted. During this interval, the sample and hold circuitry provides its output signal, while the comparator circuit inputs are reset to zero. The comparators use this time to regenerate the comparison signal to the appropriate voltage levels. At the end of the holding interval, the comparator outputs are typically only a few tens of millivolts apart, but are sufficient to initiate the regeneration process. The fact that such an output signal is very small makes such a system highly susceptible to noise events, which often lead to a phenomenon called "sparkle codes" (a condition in which the ADC provides unpredictable conversion bits).

This comparison event also often creates a large disturbance on the hold signal, thereby corrupting the signal as it is being sampled by the downstream pipeline stage. Ending the sampling period prior to latching the comparator helps to prevent this corruption. However, this further complicates the circuit design, since the ending of the sampling period corresponds to a disconnection of a large capacitance from the output mode, which creates further disturbance. Hence, to achieve the fast comparison time (e.g., 200 picoseconds), the comparator input devices must be very fast and, therefore, very small. However, small devices have inherently large mismatches which can directly translate to differential nonlinearity (DNL) errors. Further, because the comparator latching disturbance is very fast, the operational amplifier holding the analog signal is typically unable to react quickly enough to counteract this. Dual stage amplifiers can minimize this disturbance due to the local Miller feedback at the output creating a very low impedance output stage. However, dual stage amplifiers consume more circuit space and power.

As shown in FIG. 4, unlike conventional end sampling comparison systems, a pipelined ADC in accordance with the presently claimed invention is still sampling this signal when the comparator is enabled, thereby creating a disturbance on the sampled signal to be resolved before the end of the sampling phase, i.e., at the trailing edge of the first clock signal 31aa. Advantageously, the time necessary to resolve this disturbance is half the sampling period (e.g., 4000 picoseconds in one example embodiment). This is significantly longer than the disturbance resolution time of the conventional end sampling comparison systems, thereby providing ample time to resolve this disturbance. Such a long settling time ensures that the residual error will be within the Vref/4 volts correction range of the ADC stage. Hence, as seen in FIG. 4, in contrast to conventional end sampling comparison systems, the leading edge of the new latch signal 31b occurs approximately midway the sampling interval. Additionally, the new comparator output signal 17ba and time aligned output signal 33A are no longer concurrent. More specifically, the leading edge of the comparator output signal 17*ba* is shifted back by half a clock cycle, since it is controlled by the latch control signal 31*b*. As a result, the comparator output signal 17*ba* is re-timed in accordance with the leading edge of the reset signal 31*ac*.

With reference to FIGS. 3A, 3B, 3C and 3D, in conjunction with FIG. 4, the latch control signal 31*b* is derived from signals 31*q*, 31*aaaz* and 31*abaz*. Signal 31*q* serves as a re-timing signal for signals 31*aaaz* and 31*abaz*, thereby initiating the leading edge of the latch control signal 31*b* in the middle of the assertion interval of clock signal 31*aa*. The buffer amplifiers 50*o*, 50*p*, 50*q*, 50*r* provide some additional delay for signal 31*q* to match the delay within the clock generator circuit 30*a*. The trailing edge of the latch control signal 31*b* occurs in response to the trailing edges of clock signals 31*aaaz* and 31*abaz*.

Regarding the output signals 17*ba*, 17*bb* from the latch comparator, since the comparator is latched by the latch control signal 31*b*, these signals 17*ba*, 17*bb* are offset in time by half a clock cycle from where they are needed. Accordingly, the signals are re-timed by the reset signal 31*ac* with the latches 42*b*, 42*c* within the time alignment circuitry 32.

Figure 5:
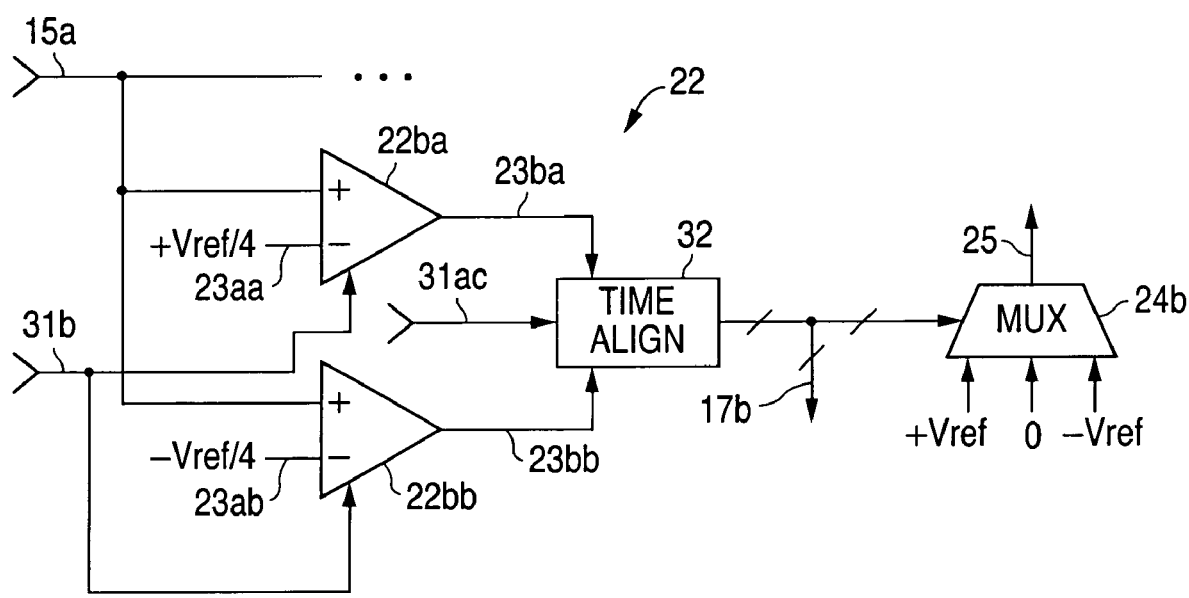
FIG. 5 is a block diagram for an exemplary embodiment of the sub-ADC in FIG. 2.

Referring to FIG. 5, the sub-ADC circuitry 22 includes latched voltage comparators 22*ba*, 22*bb* and the time alignment circuit 32. The incoming analog signal 15*a* is compared to the reference signals 23*aa*, 23*ab* (positive and negative forms of one-fourth of the reference voltage Vref). The resulting comparison signals 23*ba*, 23*bb* (latched by the latch signal 31*b*) are time-aligned in accordance with the reset signal 31*ac*, thereby providing the two-bit output signal 17*b*. These bits are often converted to the analog signal 25 by controlling a multiplexor 24*b* having the positive +Vref and negative −Vref reference voltages, and a zero voltage as its three inputs.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including double-sampled pipeline analog-to-digital conversion (ADC) circuitry having a plurality of serially coupled 1.5 bit ADC stages, comprising:
   at least one electrode to convey an upstream residue signal from an upstream ADC stage;
   residue signal generation circuitry coupled to said at least one electrode and responsive to said upstream residue signal, an analog quantization signal, a reset control signal and a first portion of a plurality of clock signals by providing a downstream residue signal;
   sub-ADC circuitry coupled to said at least one electrode and responsive to said upstream residue signal and a latch control signal by providing first and second digital quantization signals;
   digital-to-analog conversion (DAC) circuitry coupled to said sub-ADC circuitry and said residue signal generation circuitry, and responsive to said first and second digital quantization signals by providing said analog quantization signal; and
   timing and control circuitry coupled to said residue signal generation circuitry and said sub-ADC circuitry, and responsive to at least a main clock signal by providing said reset control signal, said first portion of said plurality of clock signals and said latch control signal, wherein each one of said first portion of said plurality of clock signals includes respective leading and trailing signal state transitions, said latch control signal includes leading and trailing signal state transitions, and at least one of said leading and trailing latch control signal state transitions occurs approximately midway said leading and trailing clock signal state transitions.

2. The apparatus of claim 1, wherein said residue signal generation circuitry comprises sample and hold circuitry responsive to said first portion of said plurality of clock signals by sampling said upstream residue signal and summing said analog quantization signal therewith to provide said downstream residue signal.

3. The apparatus of claim 1, wherein said sub-ADC circuitry comprises:
   comparator circuitry responsive to said upstream residue signal and a plurality of reference signals by providing a plurality of difference signals indicative of differences between said upstream residue signal and respective ones of said plurality of reference signals; and
   latch circuitry coupled to said comparator circuitry and responsive to said latch control signal by latching said plurality of difference signals to provide said first and second digital quantization signals.

4. The apparatus of claim 1, wherein said timing and control circuitry comprises:
   clock generator circuitry responsive to at least said main clock signal by providing said plurality of clock signals and an intermediate control signal;
   latch control circuitry coupled to said clock generator circuitry and responsive to said intermediate control signal and a second portion of said plurality of clock signals by providing said latch control signal; and
   reset control circuitry coupled to said clock generator circuitry and responsive to a third portion of said plurality of clock signals by providing said reset control signal.

5. The apparatus of claim 1, further comprising timing alignment circuitry coupled to said timing and control circuitry and responsive to said first and second digital quantization signals and said reset control signal by selectively combining and latching said first and second digital quantization signals to provide corresponding first and second latched quantization signals in synchronization with said reset control signal.

6. An apparatus including double-sampled pipeline analog-to-digital conversion (ADC) circuitry having a plurality of serially coupled 1.5 bit ADC stages, comprising:
   residue signal generator means for receiving an upstream residue signal from an upstream ADC stage, an analog quantization signal, a reset control signal and a first portion of a plurality of clock signals and in response thereto generating a downstream residue signal;
   sub-ADC means for receiving said upstream residue signal and a latch control signal and in response thereto generating first and second digital quantization signals;
   digital-to-analog conversion (DAC) means for receiving said first and second digital quantization signals and in response thereto generating said analog quantization signal; and
   timing and control means for receiving at least a main clock signal and in response thereto generating said reset control signal, said first portion of said plurality of clock signals and said latch control signal, wherein each one of said first portion of said plurality of clock signals includes respective leading and trailing signal state transitions, said latch control signal includes leading and trailing signal state transitions, and at least one of said leading and trailing latch control signal state transitions occurs approximately midway said leading and trailing clock signal state transitions.

7. The apparatus of claim 6, further comprising timing alignment means for receiving said first and second digital quantization signals and said reset control signal and in response thereto selectively combining and latching said first and second digital quantization signals to provide corresponding first and second latched quantization signals in synchronization with said reset control signal.

8. A method of performing double-sampled pipeline analog-to-digital conversion (ADC) of a signal with a plurality of serially coupled 1.5 bit ADC stages, comprising:
   receiving an upstream residue signal from an upstream ADC stage;
   receiving an analog quantization signal;
   receiving a reset control signal;
   receiving a first portion of a plurality of clock signals;
   receiving a latch control signal;
   receiving at least a main clock signal;
   generating a downstream residue signal in response to said upstream residue signal, said analog quantization signal, said reset control signal and said first portion of a plurality of clock signals;
   generating first and second digital quantization signals in response to said upstream residue signal and said latch control signal;
   generating said analog quantization signal in response to said first and second digital quantization signals; and
   generating said reset control signal, said first portion of said plurality of clock signals and said latch control signal in response to at least said main clock signal;
   wherein each one of said first portion of said plurality of clock signals includes respective leading and trailing signal state transitions, said latch control signal includes leading and trailing signal state transitions, and at least one of said leading and trailing latch control signal state transitions occurs approximately midway said leading and trailing clock signal state transitions.

9. The method of claim 8, wherein said generating a downstream residue signal in response to said upstream residue signal, said analog quantization signal, said reset control signal and said first portion of a plurality of clock signals comprises sampling said upstream residue signal in response to said first portion of said plurality of clock signals and summing said analog quantization signal therewith to produce said downstream residue signal.

10. The method of claim 8, wherein said generating first and second digital quantization signals in response to said upstream residue signal and said latch control signal comprises:
   receiving a plurality of reference signals;
   comparing said upstream residue signal and respective ones of said plurality of reference signals and in response thereto generating a plurality of difference signals indicative of differences between said upstream residue signal and said respective ones of said plurality of reference signals; and
   latching said plurality of difference signals in response to said latch control signal to produce said first and second digital quantization signals.

11. The method of claim 8, wherein said generating said reset control signal, said first portion of said plurality of clock signals and said latch control signal in response to at least said main clock signal comprises:
   generating said plurality of clock signals and an intermediate control signal in response to at least said main clock signal;
   generating said latch control signal in response to said intermediate control signal and a second portion of said plurality of clock signals; and
   generating said reset control signal in response to a third portion of said plurality of clock signals.

12. The method of claim 8, further comprising selectively combining and latching said first and second digital quantization signals in response to said first and second digital quantization signals and said reset control signal to produce corresponding first and second latched quantization signals in synchronization with said reset control signal.

* * * * *